(12) United States Patent
Yashiro et al.

(10) Patent No.: US 9,783,911 B2
(45) Date of Patent: Oct. 10, 2017

(54) APPARATUS FOR PRODUCING SIC SINGLE CRYSTAL BY SOLUTION GROWTH METHOD, AND METHOD FOR PRODUCING SIC SINGLE CRYSTAL BY USING THE PRODUCTION APPARATUS AND CRUCIBLE USED IN THE PRODUCTION APPARATUS

(71) Applicants: Nobuyoshi Yashiro, Tokyo (JP); Kazuhito Kamei, Tokyo (JP); Kazuhiko Kusunoki, Tokyo (JP); Nobuhiro Okada, Tokyo (JP); Koji Moriguchi, Tokyo (JP); Hironori Daikoku, Susono (JP); Hidemitsu Sakamoto, Susono (JP); Motohisa Kado, Susono (JP)

(72) Inventors: Nobuyoshi Yashiro, Tokyo (JP); Kazuhito Kamei, Tokyo (JP); Kazuhiko Kusunoki, Tokyo (JP); Nobuhiro Okada, Tokyo (JP); Koji Moriguchi, Tokyo (JP); Hironori Daikoku, Susono (JP); Hidemitsu Sakamoto, Susono (JP); Motohisa Kado, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 243 days.

(21) Appl. No.: 14/410,969

(22) PCT Filed: Jul. 15, 2013

(86) PCT No.: PCT/IB2013/001524
§ 371 (c)(1),
(2) Date: Dec. 23, 2014

(87) PCT Pub. No.: WO2014/013305
PCT Pub. Date: Jan. 23, 2014

(65) Prior Publication Data
US 2015/0191848 A1    Jul. 9, 2015

(30) Foreign Application Priority Data

Jul. 18, 2012 (JP) ................................. 2012-159591

(51) Int. Cl.
*C30B 19/02* (2006.01)
*C30B 15/10* (2006.01)
(Continued)

(52) U.S. Cl.
CPC .............. *C30B 15/10* (2013.01); *C30B 15/32* (2013.01); *C30B 19/04* (2013.01); *C30B 19/067* (2013.01);
(Continued)

(58) Field of Classification Search
CPC ...................................................... C30B 19/02
See application file for complete search history.

(56) References Cited

U.S. PATENT DOCUMENTS 8,118,933 B2 * 2/2012 Sakamoto ............... C30B 19/04
117/76
8,685,163 B2 * 4/2014 Terashima ................ C30B 9/10
117/11
2007/0209573 A1 9/2007 Kusunoki et al.

FOREIGN PATENT DOCUMENTS

EP      0 509 312 A2    10/1992
JP      A-63-210098     8/1988
(Continued)

*Primary Examiner* — Robert M Kunemund
(74) *Attorney, Agent, or Firm* — Oliff PLC

(57) ABSTRACT

A production apparatus is used for a solution growth method. The production apparatus includes a seed shaft and a crucible. The seed shaft has a lower end surface to which an SiC seed crystal is attached. The crucible contains an SiC solution. The crucible includes a cylindrical portion, a bottom portion, and an inner lid. The bottom portion is disposed at a lower end of the cylindrical portion. The inner lid is disposed in the cylindrical portion. The inner lid has a (Continued)

through hole and is positioned below a liquid surface of the SiC solution when the SiC solution is contained in the crucible.

3 Claims, 4 Drawing Sheets

(51) Int. Cl.
*C30B 19/04* (2006.01)
*C30B 19/06* (2006.01)
*C30B 29/36* (2006.01)
*C30B 15/32* (2006.01)

(52) U.S. Cl.
CPC ......... *C30B 29/36* (2013.01); *Y10T 117/1032* (2015.01)

(56) References Cited

FOREIGN PATENT DOCUMENTS

| | | |
|---|---|---|
| JP | H05-345700 A | 12/1993 |
| JP | A-2006-117441 | 5/2006 |
| JP | A-2011-98870 | 5/2011 |
| JP | A-2011-251881 | 12/2011 |
| JP | 2014-518194 A | 7/2014 |

\* cited by examiner

APPARATUS FOR PRODUCING SIC SINGLE CRYSTAL BY SOLUTION GROWTH METHOD, AND METHOD FOR PRODUCING SIC SINGLE CRYSTAL BY USING THE PRODUCTION APPARATUS AND CRUCIBLE USED IN THE PRODUCTION APPARATUS

BACKGROUND OF THE INVENTION

1. Field of the Invention

The present invention relates to an apparatus for producing a silicon carbide (SiC) single crystal by a solution growth method, and a method for producing the SiC single crystal by using the production apparatus and a crucible that is used in the production apparatus.

2. Description of Related Art

SiC is a thermally and chemically stable compound semiconductor. Due to its superiority to silicon (Si) in terms of band gap, breakdown voltage, electron saturation velocity, and thermal conductivity, SiC has been attracting much attention as a material for next-generation power devices.

A sublimation method has been most commonly used as a method for producing an SiC single crystal. However, the SiC single crystal produced by the sublimation method tends to cause defects such as a micropipe defect.

Another method for producing the SiC single crystal is a solution growth method. In the solution growth method, a seed crystal that is composed of the SiC single crystal is brought into contact with an SiC solution. The SiC solution refers to a solution that is prepared by dissolving carbon (C) in a melt of Si or an Si alloy. Then, a super-cooled condition of the SiC solution is created in the vicinity of the seed crystal to grow the SiC single crystal on a surface of the seed crystal.

The SiC single crystal obtained by the solution growth method has the reduced number of defects such as the micropipe defect. However, a growth speed of the SiC single crystal is lower in the solution growth method than in the sublimation method.

In order to increase the growth speed of the SiC single crystal that is produced by the solution growth method, Japanese Patent Application Publication No. 2006-117441 (JP 2006-117441 A), for example, discloses a method for producing the high-quality SiC single crystal at a high growth speed by uniformly supplying a solute to the seed crystal. In the above publication, a rotational speed of a crucible or the rotational speed and a rotational direction of the crucible are periodically changed.

Despite the above, a further increase in the growth speed has been desired.

In order to further increase the growth speed, a method for increasing a degree of supersaturation of carbon in the SiC solution is considered. If an increased amount of carbon is supplied to the vicinity of the seed crystal in the SiC solution, the degree of supersaturation of carbon can be increased.

SUMMARY OF THE INVENTION

The present invention has a purpose to provide an apparatus for producing an SiC single crystal in which carbon can be supplied sufficiently to a vicinity of a seed crystal in an SiC solution, and a method for producing the SiC single crystal by using the production apparatus and a crucible that is used in the production apparatus.

The apparatus for producing an SiC single crystal according to a first aspect of the present invention is used in a solution growth method. The production apparatus includes a seed shaft and the crucible. The seed shaft has a lower end surface to which an SiC seed crystal is attached. The crucible contains the SiC solution. The crucible includes a cylindrical portion, a bottom portion, and an inner lid. The bottom portion is disposed at a lower end of the cylindrical portion. The inner lid is disposed in the cylindrical portion. The inner lid is positioned below a liquid surface of the SiC solution and includes a through hole.

The crucible according to a second aspect of the present invention is used in the production apparatus described above.

A method for producing the SiC single crystal according to a third aspect of the present invention uses the production apparatus described above.

In the apparatus for producing the SiC single crystal according to the above aspects of the present invention, and also in the method for producing the SiC single crystal by using the production apparatus and the crucible that is used in the production apparatus, carbon can be supplied sufficiently to the vicinity of the seed crystal in the SiC solution.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
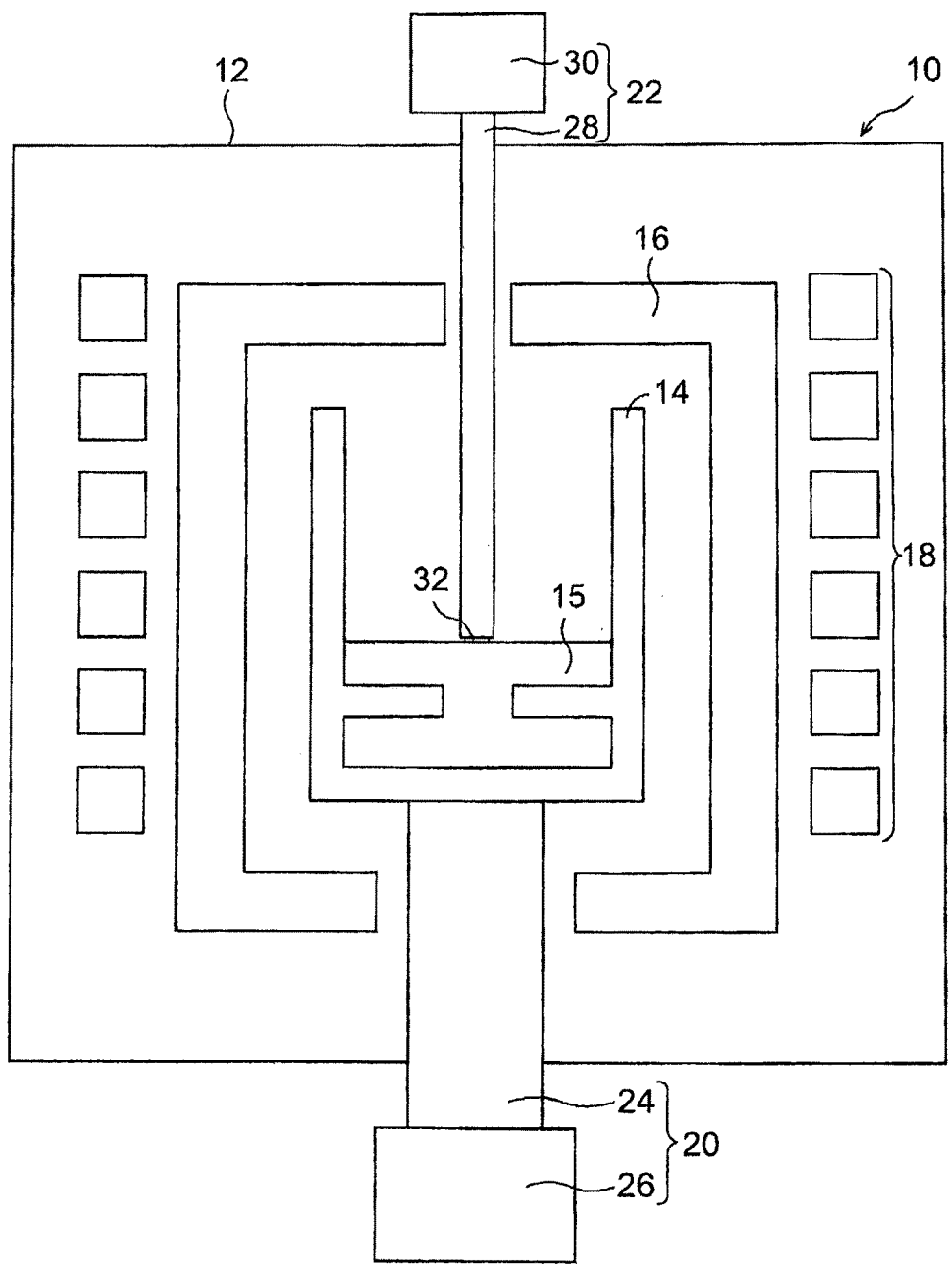
FIG. 1 is a schematic view of an apparatus for producing an SiC single crystal according to an embodiment of the present invention.

An apparatus for producing an SiC single crystal according to an embodiment of the present invention is used for a solution growth method. The production apparatus includes a seed shaft and a crucible. The seed shaft has a lower end surface to which an SiC seed crystal is attached. The crucible contains an SiC solution. The crucible includes a cylindrical portion, a bottom portion, and an inner lid. The bottom portion is disposed at a lower end of the cylindrical portion. The inner lid is disposed in the cylindrical portion. The inner lid includes a through hole and is positioned below a liquid surface of the SiC solution when the SiC solution is contained in the crucible.

During the production of the SiC single crystal, vortices are formed in the SiC solution in the vicinities of the liquid surface and the cylindrical portion and also in the vicinities of the bottom portion and the cylindrical portion. In the production apparatus, the inner lid is positioned between the vortex that is formed in the vicinity of the liquid surface and the vortex that is formed in the vicinity of the bottom portion.

If the inner lid is not provided, the vortex that is formed in the vicinity of the liquid surface interferes with the vortex that is formed in the vicinity of the bottom portion to interrupt creation of an upward flow toward a crystal growth surface of the SiC seed crystal. Even if the upward flow is created, a flow speed tends to be low. Thus, carbon cannot be supplied sufficiently to the vicinity of the SiC seed crystal.

On the other hand, when the inner lid is provided, the vortex that is formed in the vicinity of the liquid surface and the vortex that is formed in the vicinity of the bottom portion do not interfere with each other. Accordingly, the upward flow that passes through the through hole and moves toward the crystal growth surface of the SiC seed crystal can be created easily. This upward flow is faster than the upward flow created in a circumstance that the inner lid is not provided. Thus, carbon can be supplied sufficiently to the vicinity of the SiC seed crystal.

Preferably, a ratio of a diameter of the through hole to an inner diameter of the cylindrical portion is 0.40 or greater. In this case, a supply of carbon to the vicinity of the SiC seed crystal is further increased.

Further preferably, a ratio of a distance between the liquid surface of the SiC solution and an upper surface of the inner lid to a distance between a lower surface of the inner lid and an upper surface of the bottom portion is 0.17 to 2.86. In this case, the supply of carbon to the vicinity of the SiC seed crystal is increased even further.

The crucible according to the embodiment of the present invention is used in the apparatus for producing the SiC single crystal by a solution growth method, and can contain the SiC solution. The crucible includes the cylindrical portion, the bottom portion, and the inner lid. The bottom portion is disposed at the lower end of the cylindrical portion. The inner lid is disposed in the cylindrical portion and has the through hole.

In this case, the upper surface of the inner lid can be positioned in the SiC solution when the SiC solution is contained in the crucible. Because the SiC solution that is positioned below the inner lid is likely to have a higher temperature and higher pressure than the SiC solution that is positioned above the inner lid, the SiC solution that is positioned below the inner lid tends to move upward to the SiC seed crystal. Consequently, carbon can be supplied sufficiently to the vicinity of the SiC seed crystal.

A method for producing the SiC single crystal according to the embodiment of the present invention uses the production apparatus.

A detailed description will hereinafter be made on the apparatus for producing the SiC single crystal according to the embodiment of the present invention with reference to the drawings. The same or similar portions in the drawings are denoted by the same reference numerals, and their description is not repeated.

[Production Apparatus]

FIG. 1 is a schematic view of an apparatus for producing an SiC single crystal 10 according to the embodiment of the present invention.

The production apparatus 10 includes a chamber 12, a crucible 14, a heat insulation member 16, a heating device 18, a rotating device 20, and a lifting device 22.

The chamber 12 accommodates the crucible 14 therein. The chamber 12 is cooled when the SiC single crystal is produced.

The crucible 14 contains an SiC solution 15. The SiC solution 15 contains silicon (Si) and carbon (C).

The SiC solution 15 is produced by dissolving a raw material of SiC by heat. The raw material of SiC is, for example, pure silicon (Si), or a compound of Si and another metal element. Examples of the metal element include titan (Ti), manganese (Mn), chromium (Cr), cobalt (Co), vanadium (V), Iron (Fe), and the like. Among these metal elements, Ti and Mn are preferred, and Ti is further preferred. In addition, the raw material of SiC may contain carbon (C).

Preferably, the crucible 14 contains carbon. The crucible 14 may be made of graphite or SiC, for example. An inner surface of the crucible 14 may be coated with SiC. Accordingly, the crucible 14 serves as a carbon supply source for the SiC solution 15.

The insulation member 16 is formed from a heat insulation material and surrounds the crucible 14.

The heating device 18 is, for example, a high-frequency coil and surrounds sidewalls of the insulation member 16. The heating device 18 inductively heats the crucible 14 to produce the SiC solution 15.

Furthermore, the heating device 18 maintains the SiC solution 15 at a growth temperature. A crystal growth temperature depends on the composition of the SiC solution 15. The typical crystal growth temperature is 1,600 to 2,000° C.

The rotating device 20 includes a rotational shaft 24 and a drive source 26.

The rotational shaft 24 extends in a height direction of the chamber 12 (a vertical direction of FIG. 1). An upper end of the rotational shaft 24 is positioned in the insulation member 16. The crucible 14 is disposed on the upper end of the rotational shaft 24. A lower end of the rotational shaft 24 is positioned outside of the chamber 12.

The drive source 26 is disposed below the chamber 12. The drive source 26 is connected to the rotational shaft 24. The drive source 26 rotates the rotational shaft 24 about a central axis thereof.

The lifting device 22 includes the seed shaft 28 and a drive source 30.

The seed shaft 28 extends in the height direction of the chamber 12. An upper end of the seed shaft 28 is positioned outside of the chamber 12. A lower end of the seed shaft 28 is positioned in the chamber 12. An SiC seed crystal 32 is attached to a lower end surface of the seed shaft 28.

The SiC seed crystal 32 is plate-shaped and composed of the SiC single crystal. Preferably, a crystal structure of the SiC seed crystal 32 is the same as a crystal structure of the SiC single crystal to be produced. For example, when the SiC single crystal of 4H polymorph is produced, the SiC seed crystal of 4H polymorph is used. When the SiC seed crystal 32 of 4H polymorph is used, it is preferred that the SiC seed crystal 32 have a (0001) surface or a surface that is inclined at 8° or less from the (0001) surface. In this case, the SiC single crystal grows stably.

The drive source 30 is disposed above the chamber 12. The drive source 30 is connected to the seed shaft 28. The drive source 30 lifts and lowers the seed shaft 28. The drive source 30 rotates the seed shaft 28 about a central axis thereof.

[Crucible]

Figure 2:
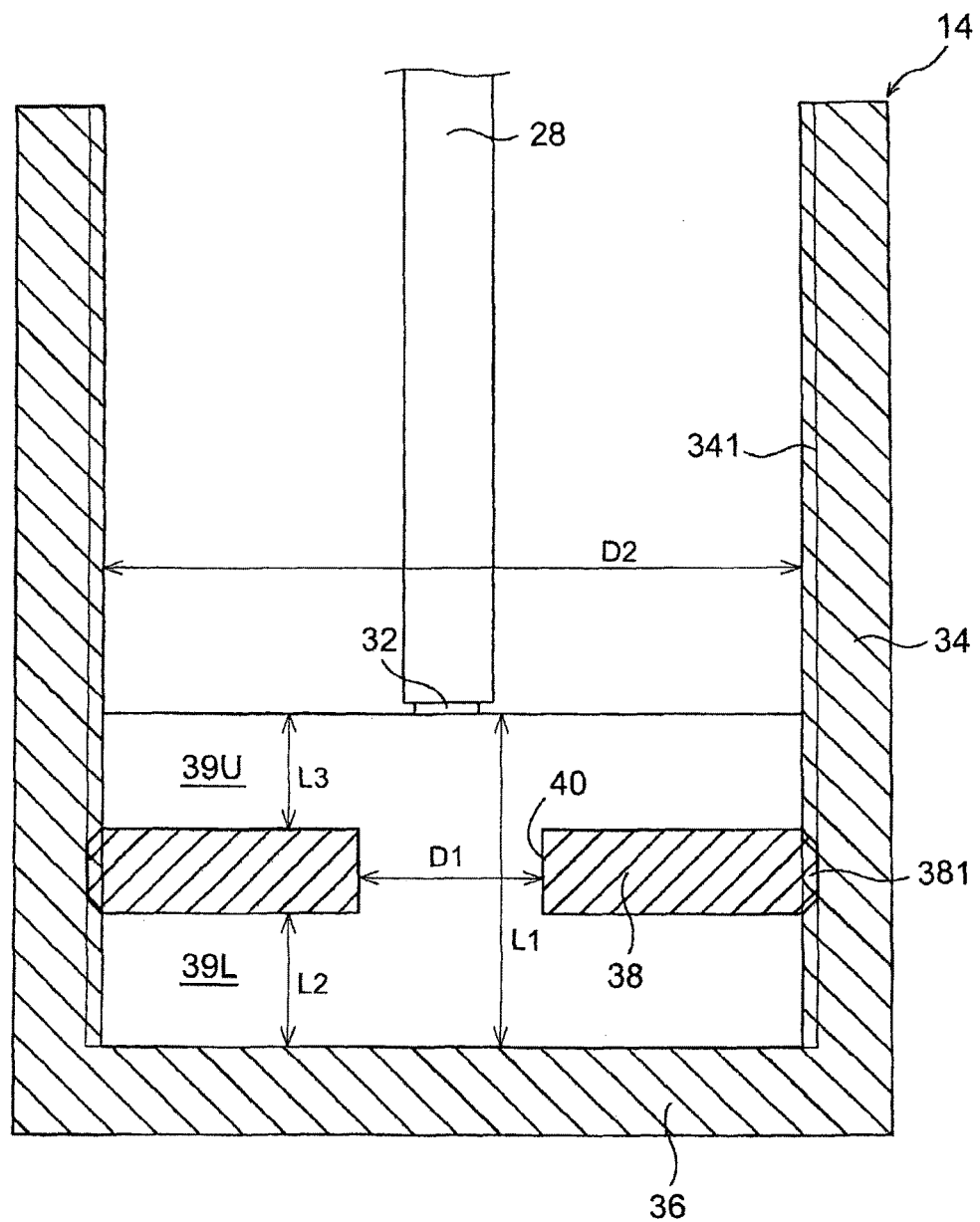
FIG. 2 is a vertical sectional view of a crucible that is shown in FIG. 1.

FIG. 2 is a vertical sectional view of the crucible 14 that is shown in FIG. 1. A description will hereinafter be made on the crucible 14 with reference to FIG. 2.

The crucible 14 includes the cylindrical portion 34, the bottom portion 36, and the inner lid 38.

The cylindrical portion 34 extends in the vertical direction. The cylindrical portion 34 is a cylinder, for example.

An inner diameter of the cylindrical portion 34 is sufficiently larger than an outer diameter of the seed shaft 28.

The bottom portion 36 is disposed at a lower end of the cylindrical portion 34. The bottom portion 36 is integrally formed with the cylindrical portion 34, for example.

The inner lid 38 is disposed apart from the bottom portion 36 and above the bottom portion 36. In other words, the inner lid 38 vertically divides a space in the crucible 14 into two. Accordingly, an upper accommodation room 39U is formed above the inner lid 38 while a lower accommodation room 39L is formed below the inner lid 38.

When the SiC solution 15 is contained in the crucible 14, the inner lid 38 is positioned below the liquid surface of the SiC solution 15. In other words, the SiC solution 15 is contained in both the upper accommodation room 39U and the lower accommodation room 39L.

The inner lid 38 further has the through hole 40. The through hole 40 extends in the vertical direction (a thickness direction of the inner lid 38). The through hole 40 connects between the upper accommodation room 39U and the lower accommodation room 39L. The through hole 40 is positioned at the center of the inner lid 38. In this case, the through hole 40 is positioned below the SiC seed crystal 32.

The inner lid 38 is fixed to the cylindrical portion 34. More specifically, an outer peripheral surface of the inner lid 38 contacts an inner peripheral surface of the crucible 14 (an inner peripheral wall of the cylindrical portion 34). In the example shown in FIG. 2, a screw groove 341 is formed on the inner peripheral wall of the cylindrical portion 34. A screw thread 381 is formed on the outer peripheral surface of the inner lid 38. With the screw thread 381 and the screw groove 341, the inner lid 38 is screwed to the cylindrical portion 34.

A description will hereinafter be made on the method for producing the SiC single crystal by using the production apparatus 10.

[Method for Producing the SiC Single Crystal]

First, for preparation of the production apparatus 10, the SiC seed crystal 32 is attached to the seed shaft 28 (a preparation step). Then, the crucible 14 is disposed in the chamber 12 to produce the SiC solution 15 (a production step). Next, the crystal growth surface of the SiC seed crystal 32 is brought into contact with the SiC solution 15 (a contact step). The SiC single crystal is then grown (a growth step). Each of the steps is described in detail below.

[Preparation Step]

First, the production apparatus 10 is prepared. Then, the SiC seed crystal 32 is attached to the lower end surface of the seed shaft 28.

[Production Step]

The raw material of SiC is contained in the crucible 14.

An amount of the raw material of SiC is adjusted such that the liquid surface of the SiC solution to be produced in this step is positioned above the upper surface of the inner lid 38. The raw material of SiC is stacked on the upper surface of the bottom portion 36 and the upper surface of the inner lid 38.

Next, the raw material of SiC in the crucible 14 is dissolved to produce the SiC solution 15. First, the chamber 12 is filled with inert gas. Then, the raw material of SiC in the crucible 14 is heated to a melting point or above by the heating device 18. The raw material of SiC in the crucible 14 that has been stacked on the inner lid 38 drops through the through hole 40 when being dissolved.

The upper surface of the inner lid 38 may be inclined downwardly from an outer peripheral side to an inner peripheral side thereof. In this case, when the raw material of SiC that has been stacked on the inner lid 38 is dissolved, the dissolved raw material of SiC (that is, the thus-produced SiC solution) is likely to pass through the through hole 40 and flow toward the bottom portion 36.

If the crucible 14 is made of graphite, carbon in the crucible 14 is dissolved into a melt of the raw material of SiC upon heating of the crucible 14, and the SiC solution 15 is produced. When carbon in the crucible 14 is dissolved in the SiC solution 15, a concentration of carbon in the SiC solution 15 approximates its saturation point.

When the SiC solution 15 is produced; the liquid surface of the SiC solution 15 is positioned above the upper surface of the inner lid 38.

[Contact Step]

Next, the crystal growth surface of the SiC seed crystal 32 is brought into contact with the SiC solution 15. More specifically, the seed shaft 28 is lowered by the drive source 30 to bring the crystal growth surface of the SiC seed crystal 32 into contact with the SiC solution 15. In this case, a temperature gradient becomes large when compared to a case where the SiC seed crystal 32 is immersed in the SiC solution 15. Accordingly, a growth speed of the SiC single crystal is increased. Needless to say, it is also possible to immerse the SiC seed crystal 32 into the SiC solution 15.

[Growth Step]

After the crystal growth surface of the SiC seed crystal 32 is brought into contact with the SiC solution 15, the SiC solution 15 is maintained at a crystal growth temperature by the heating device 18. Furthermore, the SiC solution 15 in the vicinity of the SiC seed crystal 32 is super-cooled to cause a supersaturated condition of SiC.

A method for super-cooling the SiC solution 15 in the vicinity of the SiC seed crystal 32 is not particularly limited. For example, the heating device 18 is controlled to decrease the temperature of the SiC solution 15 in the vicinity of the SiC seed crystal 32 until the temperature becomes lower than that of the SiC solution 15 in the other areas. Alternatively, the SiC solution 15 in the vicinity of the SiC seed crystal 32 may be cooled by a refrigerant. More specifically, the refrigerant is circulated in the seed shaft 28. For example, the refrigerant is the inert gas of helium (He), argon (Ar), or the like. The SiC seed crystal 32 is cooled by circulation of the refrigerant in the seed shaft 28. Accordingly, when the SiC seed crystal 32 is cooled, the solution 15 in the vicinity of the SiC seed crystal 32 is also cooled.

The SiC seed crystal 32 and the SiC solution 15 (the crucible 14) are rotated while SiC in the SiC solution 15 in the vicinity of the SiC seed crystal 32 is maintained in the supersaturated condition. The SiC seed crystal 32 is rotated along with the rotation of the seed shaft 28. Also, the crucible 14 is rotated along with the rotation of the rotational shaft 24. A rotational direction of the SiC seed crystal 32 may be the same as or opposite from a rotational direction of the crucible 14. In addition, a rotational speed may be constant or variable. The seed shaft 28 is gradually lifted while being rotated. At this time, the SiC single crystal is created on the crystal growth surface of the SiC seed crystal 32 that is immersed in the SiC solution 15, and grows thereon. The seed shaft 28 may not be lifted while being rotated. Furthermore, the seed shaft 28 may be neither lifted nor rotated.

In the production of the SiC single crystal, the growth speed of the SiC single crystal can be increased if a degree of supersaturation of carbon in the SiC solution 15 is increased.

As described above, in the production apparatus 10, the SiC solution 15 is contained in the upper accommodation room 39U and the lower accommodation room 39L. The upper accommodation room 39U and the lower accommodation room 39L are connected to each other only via the through hole 40.

During the production of the SiC single crystal, the vortices are formed in the SiC solution 15 in the vicinities of the liquid surface and the cylindrical portion 34 and also in the vicinities of the bottom portion 36 and the cylindrical portion 34. In this embodiment, the vortex is formed in the vicinity of the cylindrical portion 34 in each of the upper accommodation room 39U and the lower accommodation room 39L. In other words, the inner lid 38 is positioned between the vortex that is formed in the upper accommodation room 39U and the vortex that is formed in the lower accommodation room 39L.

If the inner lid 38 is not provided, the vortex that is formed in the vicinity of the liquid surface interferes with the vortex that is formed in the vicinity of the bottom portion 36 to interrupt creation of the upward flow to the crystal growth surface of the SiC seed crystal 32. Even if the upward flow is created, a flow speed tends to be low. Thus, carbon cannot be supplied sufficiently to the vicinity of the SiC seed crystal 32.

On the other hand, when the inner lid 38 is provided, the vortex that is formed in the vicinity of the liquid surface (the vortex that is formed in the upper accommodation room 39U) and the vortex that is formed in the vicinity of the bottom portion 36 (the vortex that is formed in the lower accommodation room 39L) do not interfere with each other. Accordingly, the upward flow that passes through the through hole 40 and moves toward the crystal growth surface of the SiC seed crystal 32 can be created easily. This upward flow is faster than the upward flow created in a circumstance that the inner lid 38 is not provided. Thus, carbon can be supplied sufficiently to the vicinity of the SiC seed crystal 32.

Preferably, a distance L1 between the liquid surface of the SiC solution 15 and the upper surface of the bottom portion 36 is 30 to 70 mm. This facilitates the creation of the upward flow in the SiC solution 15.

Preferably, a ratio L3/L2 of a distance L3 between the liquid surface of the SiC solution 15 and the upper surface of the inner lid 38 to a distance L2 between the lower surface of the inner lid 38 and the upper surface of the bottom portion 36 is 0.17 to 2.86. In this case, the growth speed of the SiC single crystal is increased. A detailed description will be made below on this point.

Figure 3:
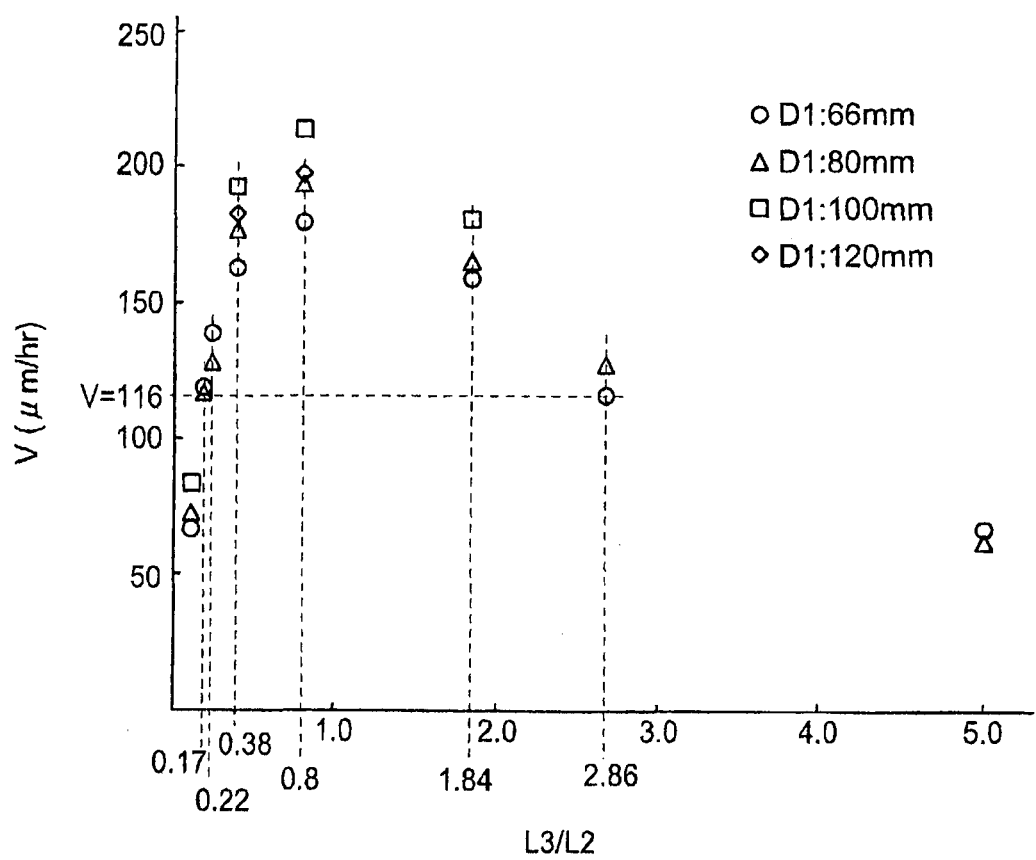
FIG. 3 is a graph that shows a relationship between a ratio of a distance between a liquid surface of an SiC solution and an upper surface of an inner lid to a distance between a lower surface of the inner lid and an upper surface of a bottom portion and a growth speed of the SiC single crystal.

FIG. 3 is a graph that shows a relationship between the ratio L3/L2 and a growth speed V (μm/hr) of the SiC single crystal. The results shown in the graph of FIG. 3 were obtained from a following experiment.

The plural crucibles were prepared. Each of the crucibles had a configuration as shown in FIG. 2. The crucibles had the through hole in different size (diameter D1: see FIG. 2) (66 mm, 80 mm, 100 mm, 120 mm). Also, the distance L2 between the lower surface of the inner lid and the upper surface of the bottom portion varied among the crucibles (9 mm, 14 mm, 19 mm, 30 mm, 39 mm, 44 mm, 46 mm, 49 mm). For each of the crucibles, an inner diameter of the crucible (an inner diameter D2 of the cylindrical portion: see FIG. 2) was 130 mm while the inner lid was 5 mm in thickness. A distance L1 between the liquid surface of the SiC solution that is contained in each of the crucibles and the upper surface of the bottom portion was 59 mm.

During the production of the SiC single crystal, the SiC seed crystal was not immersed in the SiC solution but was brought into contact with the liquid surface of the SiC solution. The SiC seed crystal was either a quadrilateral plate whose sides were 15 to 25 mm or a disc whose diameter was 2 inches. The growth temperature of the SiC single crystal was approximately 2,050° C.

Thickness of the produced SiC single crystal (growth thickness) was measured. Then, the thus obtained growth thickness was divided by a duration of growth to calculate the growth speed of the SiC single crystal.

As shown in FIG. 3, in a region where the ratio L3/L2 of the distance between the liquid surface of the SiC solution and the upper surface of the inner lid to the distance between the lower surface of the inner lid and the upper surface of the bottom portion is 0 to 0.8, the growth speed V of the SiC single crystal increases with the increase of the ratio L3/L2. The growth speed V reaches a maximum when the ratio L3/L2 is approximately 0.8. In a region where the ratio L3/L2 is greater than 0.8, the growth speed V decreases with the increase of the ratio L3/L2. As shown in FIG. 3, in a region where the ratio L3/L2 is 0.17 to 2.86, the growth speed V is 1-16 μm/hr or higher regardless of the size of the through hole. Therefore, the preferred ratio L3/L2 is in a range of 0.17 to 2.86.

The ratio L3/L2 is more preferably 0.38 or greater. The ratio L3/L2 is even more preferably 1.84 or less. In this case, the growth speed V becomes higher than 150 μm/hr regardless of the size of the through hole.

Preferably, a ratio D1/D2 of the diameter of the through hole to the inner diameter of the cylindrical portion is 0.40 or greater. Further preferably, the ratio D1/D2 is 0.50 or greater. Also, in this case, the growth speed of the SiC single crystal is increased. A detailed description will be made below on this point.

Figure 4:
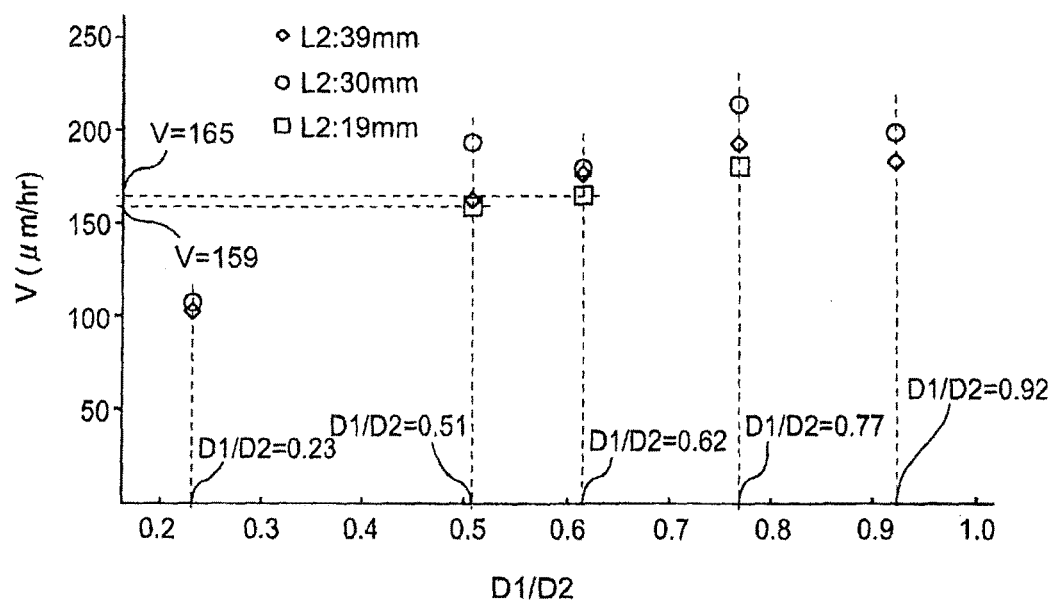
FIG. 4 is a graph that shows a relationship between a ratio of a diameter of a through hole to an inner diameter of a cylindrical portion and the growth speed of the SiC single crystal.

FIG. 4 is a graph that shows a relationship between the ratio D1/D2 and the growth speed V (μm/hr) of the SiC single crystal. The results shown in the graph of FIG. 4 were obtained from a following experiment.

The plural crucibles were prepared. Each of the crucibles had the configuration as shown in FIG. 2. The crucibles had the through hole in different size (diameter D1: see FIG. 2) (30 mm, 66 mm, 80 mm, 100 mm, 120 mm). Also, the distance L2 between the lower surface of the inner lid and the upper surface of the bottom portion varied among the crucibles (19 mm, 30 mm, 39 mm). For each of the crucibles, the inner diameter of the crucible (the inner diameter D2 of the cylindrical portion: see FIG. 2) was 130 mm while the inner lid was 5 mm in thickness. The distance L1 between the liquid surface of the SiC solution that is contained in each of the crucibles and the upper surface of the bottom portion was 59 mm.

During the production of the SiC single crystal, the SiC seed crystal was not immersed in the SiC solution but was brought into contact with the liquid surface of the SiC solution. The SiC seed crystal was either the quadrilateral plate whose sides were 15 to 25 mm or the disc whose diameter was 2 inches. The growth temperature of the SiC single crystal was approximately 2,050° C.

The thickness of the produced SiC single crystal (growth thickness) was measured. Then, the thus obtained growth thickness was divided by the duration of growth to calculate the growth speed of the SiC single crystal.

As shown in FIG. 4, the growth speed V increased with the increase of the ratio D1/D2. It was estimated that the growth speed V would become 130 μm/hr or higher if the ratio D1/D2 was 0.4 or greater. Actually, the growth speed V became 150 μm/hr or higher when the ratio D1/D2 was 0.5 or higher. Therefore, the preferred ratio D1/D2 is 0.40 or greater, and the ratio D1/D2 of 0.50 or greater is even more preferred. In addition, the preferred ratio D1/D2 is 0.92 or less.

Further preferably, the ratio D1/D2 is 0.7 to 0.8. In this case, the growth speed V becomes higher than 165 µm/hr.

The embodiment of the present invention has been described so far in detail. However, it is merely an example, and the present invention is not limited by the above-described embodiment in any way.

For example, the configuration of the production apparatus other than the crucible is not limited to that shown in FIG. 1, and any configuration can be adopted as long as the production apparatus can be used for the solution growth method.

The invention claimed is:

1. A method for producing an SiC single crystal by a solution growth method, the method comprising:

a step of preparing a seed shaft that extends in a vertical direction and a crucible that includes a cylindrical portion, a bottom portion disposed at a lower end of the cylindrical portion, and an inner lid having a through hole and disposed in the cylindrical portion;

a step of attaching an SiC seed crystal to a lower end surface of the seed shaft;

a step of heating the crucible that contains a raw material to produce an SiC solution, wherein the inner lid is positioned below a liquid surface of the produced SiC solution;

a step of bringing the SiC seed crystal that is attached to the lower end surface of the seed shaft into contact with the SiC solution; and a step of growing an SiC single crystal on the SiC seed crystal, wherein when growing the SiC single crystal, the inner lid is positioned below a crystal growth surface of the SiC seed crystal.

2. The method according to claim 1, wherein a ratio of a diameter of the through hole to an inner diameter of the cylindrical portion is 0.40 or greater.

3. The method according to claim 1, wherein a ratio of a distance between the liquid surface of the SiC solution and an upper surface of the inner lid to a distance between a lower surface of the inner lid and an upper surface of the bottom portion is 0.17 or greater and 2.86 or less.

* * * * *